(12) United States Patent
Hosono

(10) Patent No.: US 7,524,591 B2
(45) Date of Patent: Apr. 28, 2009

(54) PHOTOMASK AND MANUFACTURING METHOD THEREOF, FABRICATION PROCESS OF AN ELECTRON DEVICE

(75) Inventor: Koji Hosono, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 744 days.

(21) Appl. No.: 11/126,295

(22) Filed: May 11, 2005

(65) Prior Publication Data

US 2006/0147817 A1 Jul. 6, 2006

(30) Foreign Application Priority Data

Jan. 5, 2005 (JP) ............................. 2005-000707

(51) Int. Cl.
*G03F 1/00* (2006.01)
*G03C 5/00* (2006.01)

(52) U.S. Cl. .......................................... 430/5; 430/311
(58) Field of Classification Search .................... 430/5, 430/311, 312, 313, 394
See application file for complete search history.

(56) References Cited

U.S. PATENT DOCUMENTS 6,485,869 B2 * 11/2002 Tsai et al. ..................... 430/5
2005/0136338 A1 * 6/2005 Chang ........................... 430/5

FOREIGN PATENT DOCUMENTS

JP 10-200109 7/1998
JP 2002-252165 9/2002

* cited by examiner

*Primary Examiner*—Stephen Rosasco
(74) *Attorney, Agent, or Firm*—Fujitsu Patent Center

(57) ABSTRACT

A photomask made by using a negative photoresist includes a transparent substrate defined with a device chip area, an opaque device pattern formed on the transparent substrate in the device chip area, and a dummy opaque pattern provided on the transparent substrate outside of the device chip area.

13 Claims, 18 Drawing Sheets

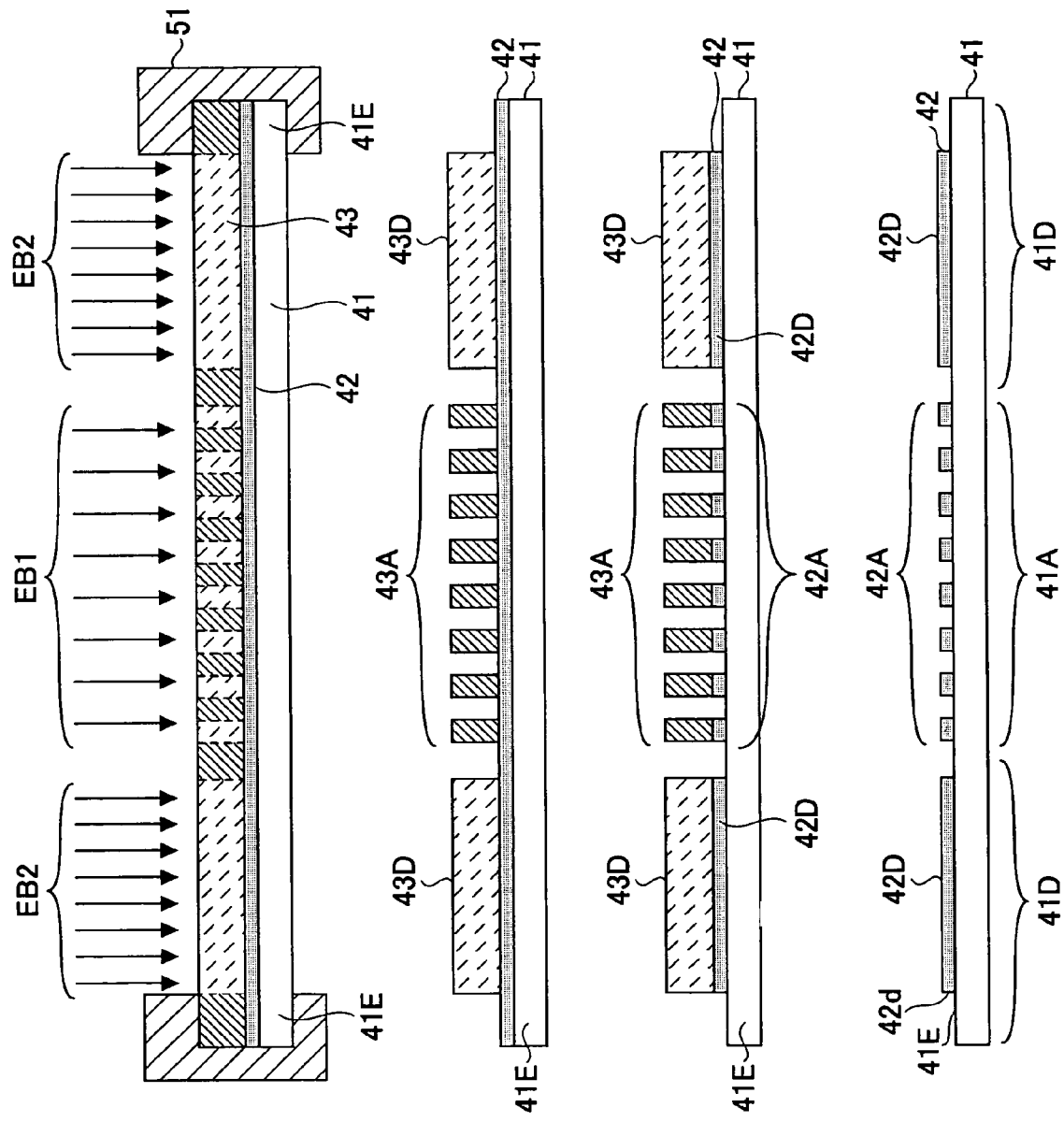

PHOTOMASK AND MANUFACTURING METHOD THEREOF, FABRICATION PROCESS OF AN ELECTRON DEVICE

CROSS-REFERENCE TO RELATED APPLICATION

The present application is based on Japanese priority application No. 2005-000707 filed on Jan. 5, 2005, the entire contents of which are hereby incorporated by reference.

BACKGROUND OF THE INVENTION

The present invention generally relates to fabrication of electron devices such as semiconductor devices or magnetic devices and more particularly to the manufacturing method of a photomask used for fabricating electron devices as well as a fabrication process of an electron device by using such a photomask.

In the fabrication of electron devices such as semiconductor devices or magnetic devices, it is generally practiced to transfer a device pattern image held on a photomask in the form of an opaque pattern onto a substrate such as a silicon wafer by way of an exposure process.

Particularly, with recent electron devices of high-performance and versatile functions, there are imposed ever stringent demands of form fidelity and high dimensional precision in view of the miniaturization of device patterns.

Thus, manufacturing of a photomask has generally conducted conventionally by using a high-resolution electron beam exposure apparatus for exposing opaque patterns, and dry etching has been used in the etching process for patterning the opaque film such as a Cr film to form the desired opaque pattern, in view of the nature of the dry etching process of small pattern variation at the time of etching.

Generally, a photomask is classified to a positive photomask and negative photomask, the positive photomask being formed by using a positive resist while the negative photomask is formed by using a negative resist. The resist type is selected as minimum exposure time dependency but occasionally using a negative resist forms a photomask having critical dimensional patterns in use of gate layer.

REFERENCES (Patent Reference 1) Japanese Laid-Open Patent Application 10-200109
(Patent Reference 2) Japanese Laid-Open Patent Application 2002-252165

SUMMARY OF THE INVENTION

FIGS. 1A-1D show a typical process of forming a negative binary photomask, while FIGS. 2A-2D show a typical process of forming a positive binary photomask.

Referring to FIG. 1A, a Cr film 12 is formed on a quartz glass substrate 11 as an opaque film, and a resist film 13 formed on the Cr film 12 is exposed in the step of FIG. 1A by a direct drawing process of a focused electron beam 14.

Because the resist film 13 is a negative resist film, a resist pattern 13A is developed as a result of the development of the resist film 13 in the step of FIG. 1B in correspondence to the exposed part shown in FIG. 1A by a broken line.

Thus, in the step of FIG. 1C, the Cr film 12 is subjected to a dry etching process while using the resist pattern 13A as a mask, and a negative photomask carrying a Cr pattern 12A on the quartz glass substrate 11 as an opaque pattern is obtained as show in FIG. 1D.

In the case of forming a positive photomask, on the other hand, a Cr film 22 is formed on a quartz glass substrate 21, and a resist film 23 formed on the Cr film 22 is exposed by a focused electron beam 24.

Here, because the resist film 23 is a positive resist film, there is formed a resist opening 23A in correspondence to the exposed part shown by a broken line in FIG. 2A as a result of development of the resist film 23 thus exposed in the step of FIG. 2B.

Thus, in the step of FIG. 2C, the Cr film 22 is subjected to a dry etching process while using the resist pattern 23A as a mask, and a positive photomask shown in FIG. 2D is obtained such that the opaque film 22 held on the quartz glass substrate 21 includes an aperture pattern 22A.

Generally, exposure of the resist film 13 or 23 by direct exposure of the focused electron beam 14 or 24 takes time and is not suited for exposing a large area. Thus, in the case of a negative photomask, the area of the resist pattern 13A formed in the development step of FIG. 1B is more or less limited, and the proportion of the Cr film 12 removed by etching in the step of FIG. 1C with regard to the entire photomask area (hereinafter called as "etching area ratio") generally takes a large value.

On the other hand, in the case of a positive photomask, the area of the resist opening 23A formed as a result of the developing step of FIG. 2B is limited, and thus, the etching area ratio of the Cr film 22 removed in the step of FIG. 2C with regard to the entire photomask area generally takes a small value.

FIG. 3 is a diagram schematically showing the photomask formed like this, particularly a negative photomask.

Referring to FIG. 3, a device chip area 11A is formed on the quartz glass substrate 11 so as to be surrounded by a blind pattern 11B, and various mask manufacturing marks 11C are formed on the glass substrate 11 for the purpose of mask alignment. As will be understood from the manufacturing process of FIG. 1C, the Cr film 12 is removed from the region outside the device chip area 11A defined by the blind pattern 11B with such a negative photomask, and thus, the transparent quartz glass substrate 11 is exposed in such a region.

On the other hand, with a positive photomask, the Cr film 22 is not removed from the outer region of the device chip area as can be seen from the step of FIG. 2C, and thus, the quartz glass substrate 21 is covered continuously with the Cr film 22 in the foregoing outside reaction.

Here, it should be noted that the blind pattern 11B is provided for the purpose of preventing multiple exposure at the time of transferring the patterns on a substrate such as a silicon wafer.

Meanwhile, in the device chip area 11A, the device pattern to be exposed is formed in the form of a Cr opaque pattern. Particularly, in the case of a positive photomask, the device chip area 11A is generally formed with patterns of via-hole/contact holes or interconnection patterns, while in the case of a negative photomask, device isolation patterns or gate patterns are generally formed in the device chip area thereof.

Now, in the art of dry etching, it is known that the etching rate generally decreases with increasing etching area and it takes a longer time for the etching. Thus, in the case of a negative photomask characterized by large etching area ratio, which is defined as the percent of the area to be etched, there is a need of applying an etching process that can remove the Cr film 12 with high selectivity with respect to the resist pattern 13A in the dry etching process of FIG. 1C because of the prolonged etching time, while such a dry etching process of high selectivity is generally characterized by weak etching anisotropy, and it is known that there tends to appear the problem of poor pattern precision as a result of the etching bias caused by lateral etching as shown in FIG. 4 by arrows. Thereby, the etching bias depends on the area to be etched, and thus, there arises the problem of etching bias that the obtained Cr pattern width may be changed in the positive photomask and in negative photomask and in the thin patterns and in the thick patterns.

As explained previously, negative photomasks of nowadays are required to have high precision similar to a positive photomask in view of the use thereof for the fabrication of recent ultra miniaturized semiconductor devices. Thus, there is a demand for the technology of controlling the etching bias at the time of making such negative photomasks.

According to a first aspect, the present invention provides a negative photomask made by using a negative photoresist, comprising:

a transparent substrate defined with a device chip area;

an opaque device pattern formed on said transparent substrate in said device chip area; and a dummy opaque pattern provided on said transparent substrate outside of said device chip area.

In another aspect, the present invention provides a method of making a negative photomask, comprising the steps of:

exposing a negative resist formed on an opaque film on a substrate to form a negative resist pattern on a device chip area of said substrate;

patterning said opaque film in said device chip area while using said negative resist pattern as a mask to form a device pattern in said device chip area of said substrate by said opaque film; and further exposing said negative resist in an outer region of said device chip area of said substrate.

Further, the present invention provides a method of fabricating an electron device including an exposure step conducted by using such a photomask.

According to the present invention, it becomes possible to reduce the amount of lateral etching at the time of forming the opaque pattern by dry etching the opaque film, by forming a dummy opaque pattern outside the device chip area, in which the opaque patterns are formed in correspondence to the device pattern, and the problem of degradation of precision of the opaque pattern constituting the device pattern, which has been caused at the time of etching an opaque film over a large area, is successfully eliminated.

Other objects and further features of the present invention will become apparent from the following detailed description when read in conjunction with the attached drawings.

BRIEF DESCRIPTION OF THE DRAWINGS

FIGS. 8A-8D are diagrams showing the manufacturing process of the negative photomask according to the first embodiment of the present invention;

DETAILED DESCRIPTION OF THE INVENTION

First Embodiment

Figure 2A:
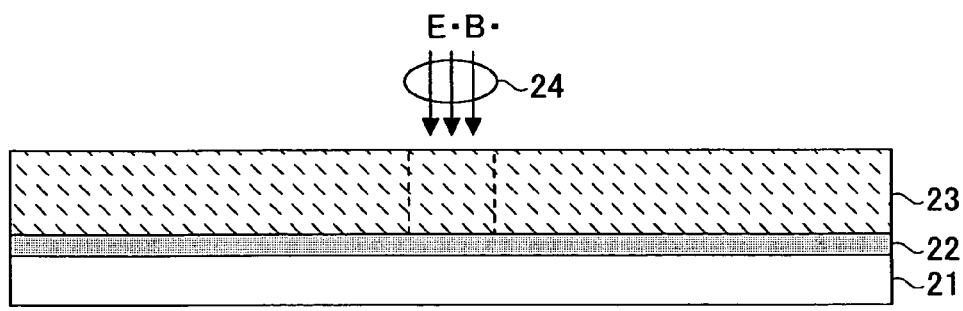
FIGS. 2A-2D are diagrams showing the process of manufacturing a conventional positive photomask.
Figure 2B:
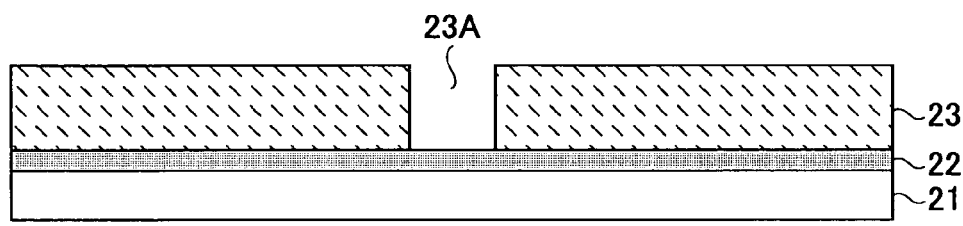
Figure 2C:
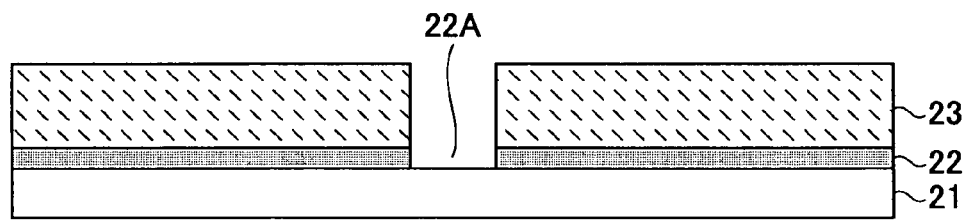
Figure 2D:
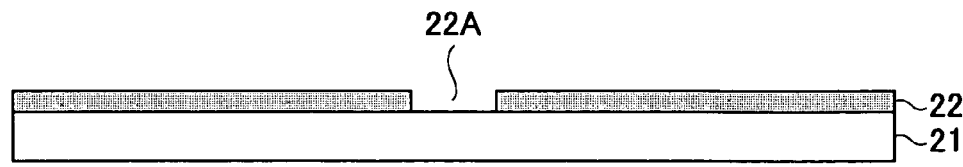
Figure 5A:
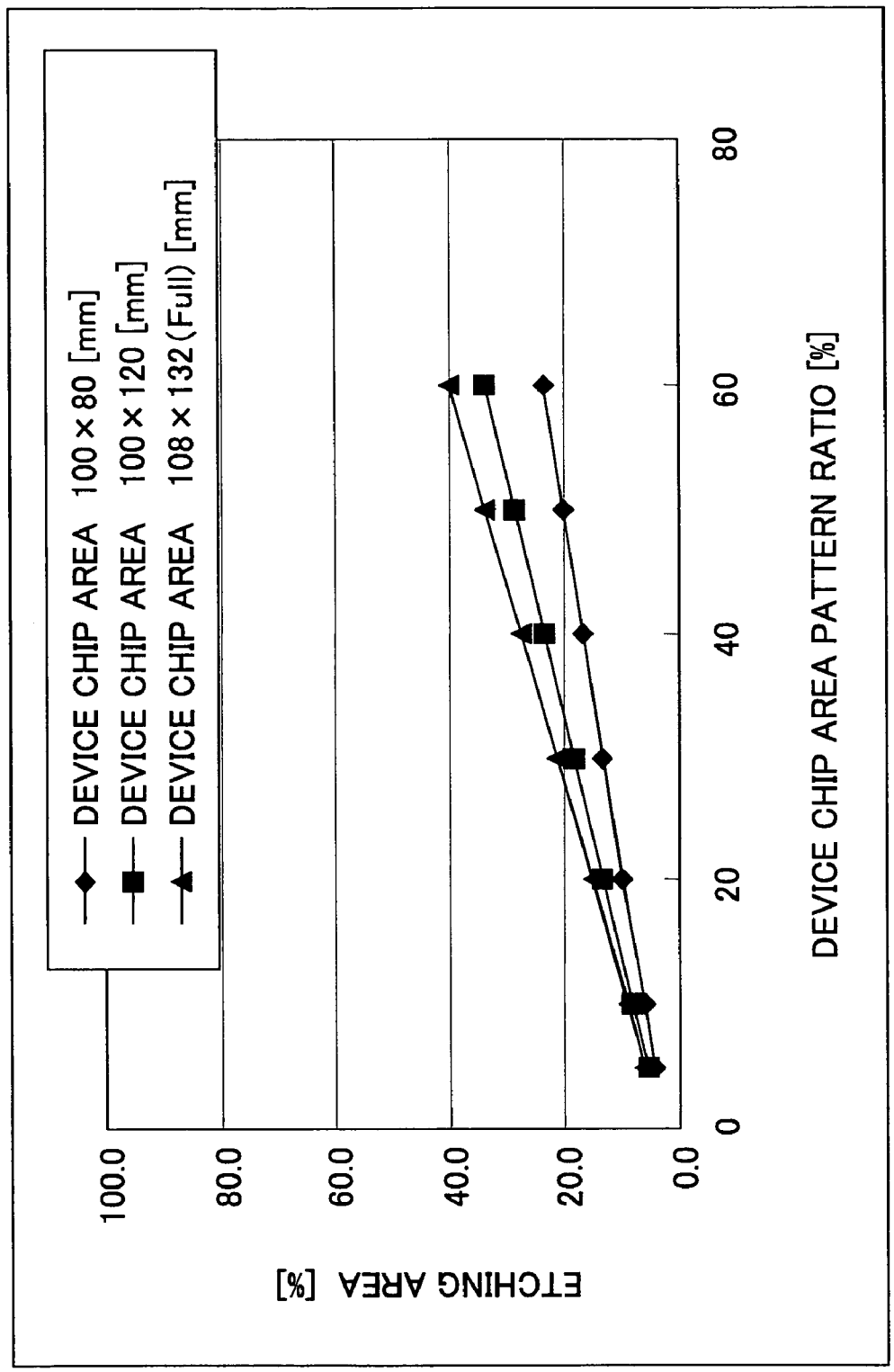
FIGS. 5A and 5B are diagrams explaining the problems of conventional photomask manufacturing technology discovered by the inventor of the present invention.
Figure 5B:
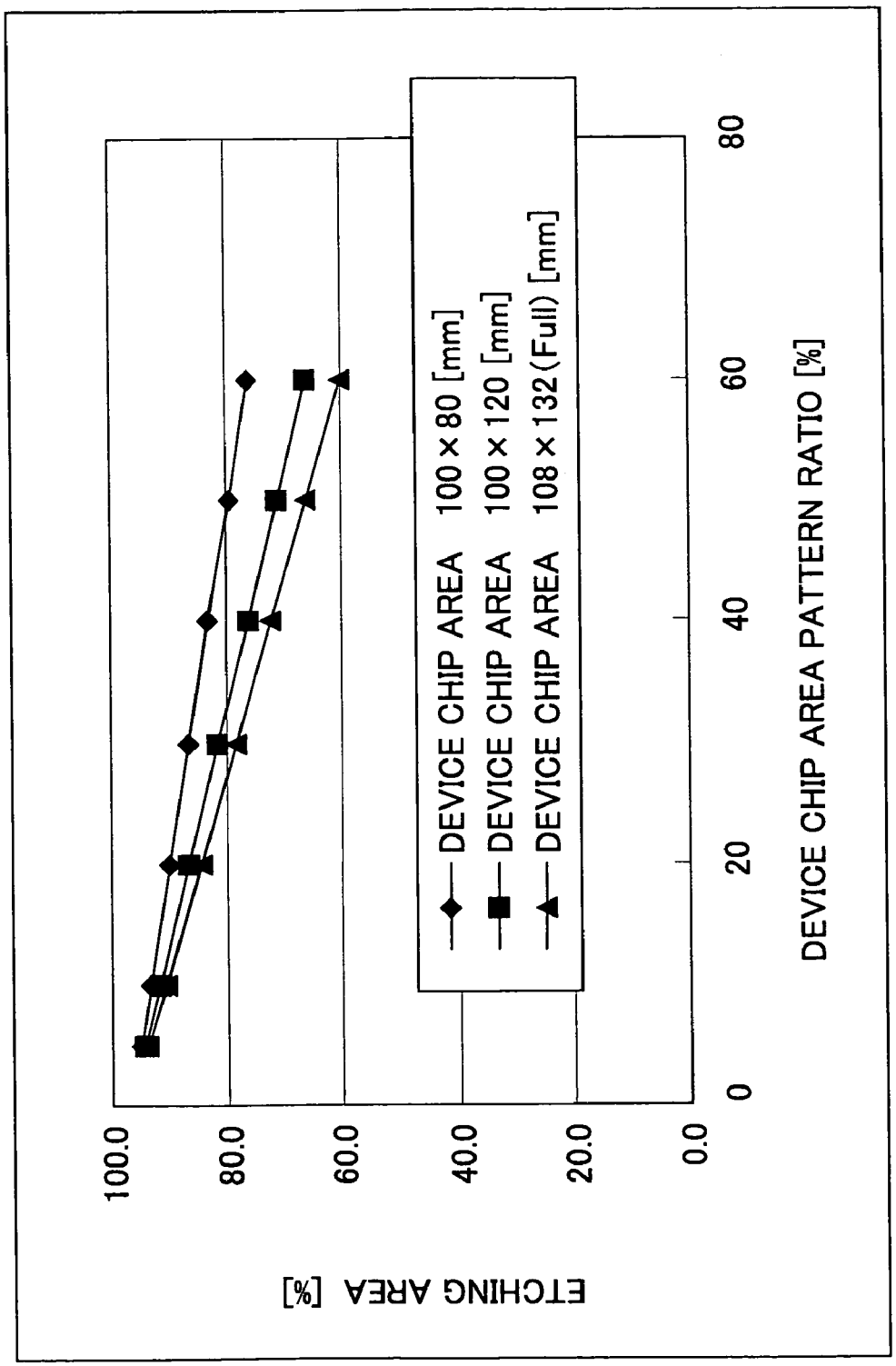

FIG. 5A shows the relationship between the Cr pattern occupation area ratio defined as the proportion of the device chip area occupied by a Cr pattern or "device chip area pattern ratio" and the proportion of the Cr film 22 removed by the dry etching process of FIG. 2C from the entire surface of the quartz glass substrate 21 defined as the "etching area", for the case of a positive photomask, while FIG. 5B shows the similar relationship between the "device chip area pattern ratio" and the "etching area" of the Cr film 11 removed from the entire surface of the quartz glass substrate 11 by the dry etching, for the case of a negative photomask. Here, it should be noted that ♦ represents the case the device chip area has a size of 100×80 mm, while ■ represents the case in which the device chip area has a size of 100×120 mm. Further, Δ represents the case in which the device chip area has a size of 108×132 mm. It should be noted that the relationships of FIGS. 5A and 5B were discovered for the first time by the inventor of the present invention in the investigation constituting the foundation of the present invention.

In the case of a positive photomask, the Cr patterns formed on the device chip area is generally divided into hole patterns having the device chip area pattern ratio of 5% or less and interconnection patterns having the device chip pattern ratio of 30-40%, wherein each of these constitutes a reticle. In the case of a positive photomask, the etching area of the Cr film is 3-5% in the case of hole patterns and 15-30% in the case of the interconnection patterns.

In the case of a negative photomask, on the other hand, the patterns formed in the device chip area 11A are primarily device isolation patterns or gate patterns having the occupation area of 30-40% (device chip area pattern ratio) for the Cr pattern. Thus, with the case of the negative photomask having such a Cr pattern occupation area, the etching area indicating the proportion of the area to be etched becomes 70-85%, which is far larger as compared with the case of a positive photomask.

Figure 6:
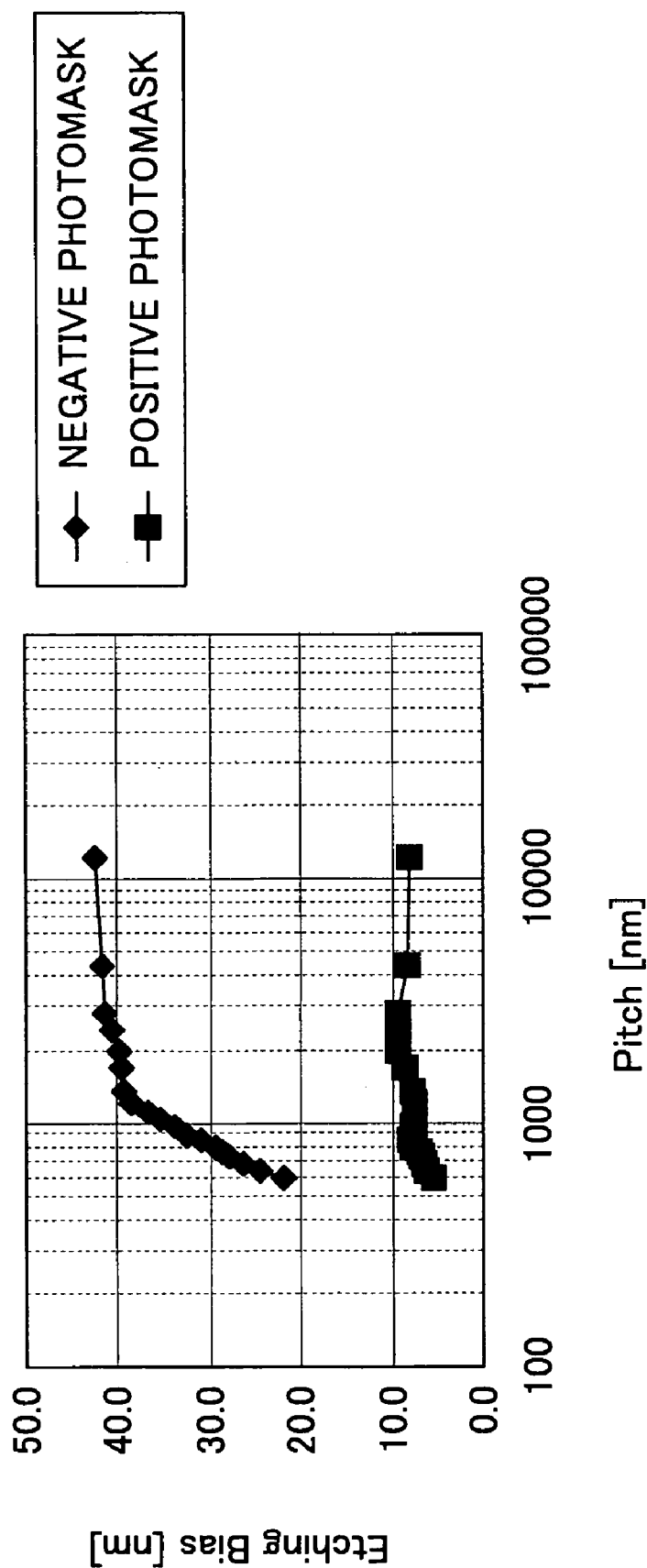
FIG. 6 is a diagram explaining the problem associated with the conventional photomask manufacturing technology discovered by the inventor of the present invention.

FIG. 6 shows the relationship between the pitch and the etching bias of a line-and-space pattern formed by using a line pattern of the width of 400 nm while changing the pattern interval for the case the line-and-space pattern is formed by using a negative photomask and for the case the line-and-space pattern is formed by using a positive photomask. Here, it should be noted that the relationship of FIG. 6 is discovered also for the first time by the inventor of the present invention in the investigation constituting the foundation of the present invention.

Figure 1A:
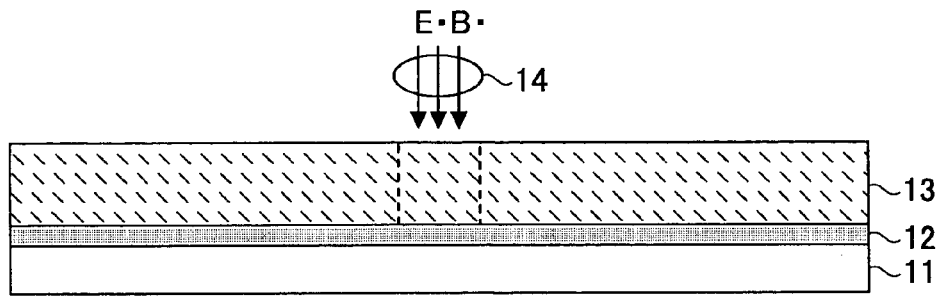
FIGS. 1A-1D are diagrams showing the process of manufacturing a conventional negative photomask.
Figure 1B:
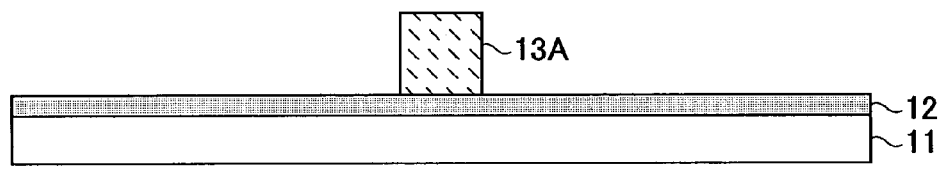
Figure 1C:
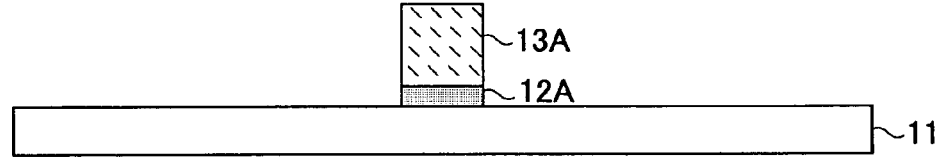
Figure 1D:
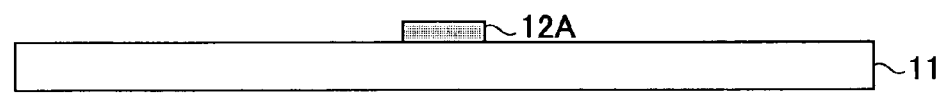

Referring to FIG. 6, ♦ represents the case of using a negative photomask and ■ represents the case of using a positive photomask, wherein it will be noted that the etching bias exceeds 40 nm in the case the negative photomask, characterized by large etching area and at the same time subjected to the demand of high etching selectivity, is used in the dry etching step of FIG. 1C. Further, it will be noted that the etching bias changes with the pitch.

In the case of a positive photomask, in which the etching area ratio is small and powerful dry etching process can be used in the dry etching step of FIG. 2C, the etching bias is less than 10 nm and there appears little pattern pitch dependence in the etching bias.

Figure 7A:
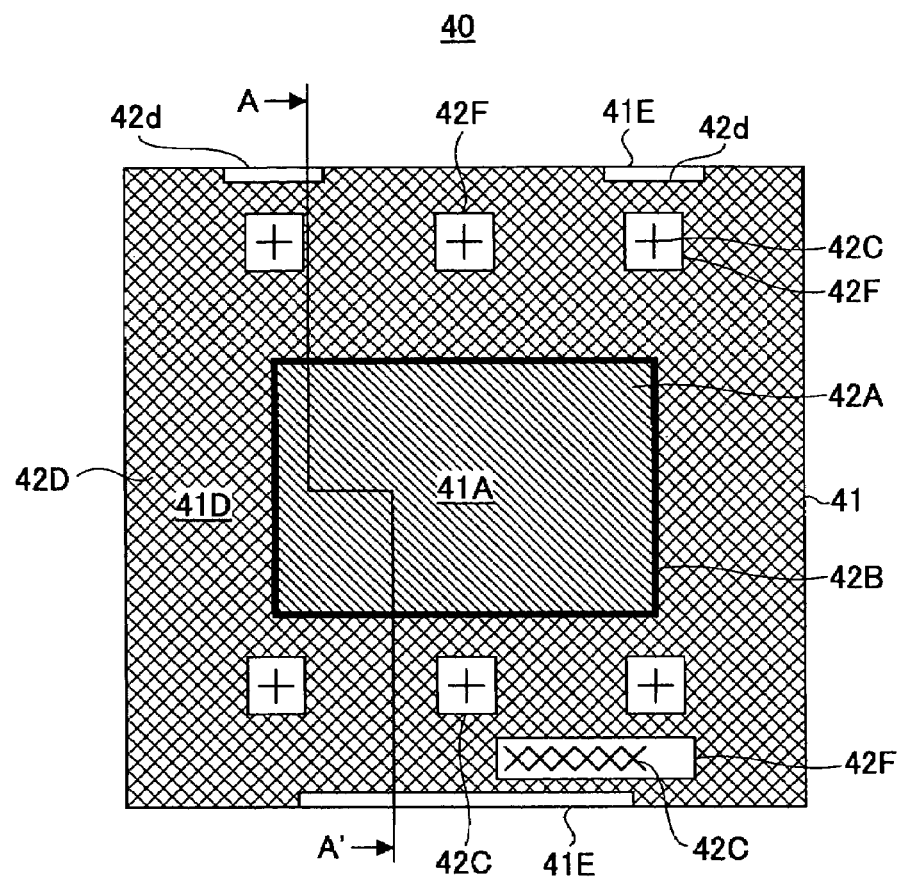
FIGS. 7A and 7B are diagrams showing a negative photomask according to a first embodiment of the present invention respectively in a plan view and in a cross-sectional view.
Figure 7B:
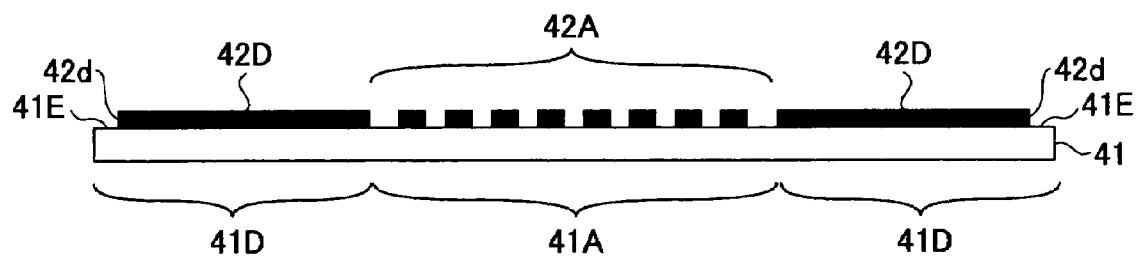

FIGS. 7A and 7B show the construction of a negative photomask 40 according to a first embodiment of the present invention, wherein FIG. 7A shows the photomask 40 in a plan view while FIG. 7B shows the photomask 40 of FIG. 7A in a cross-sectional view taken along a line A-A'.

Figure 3:
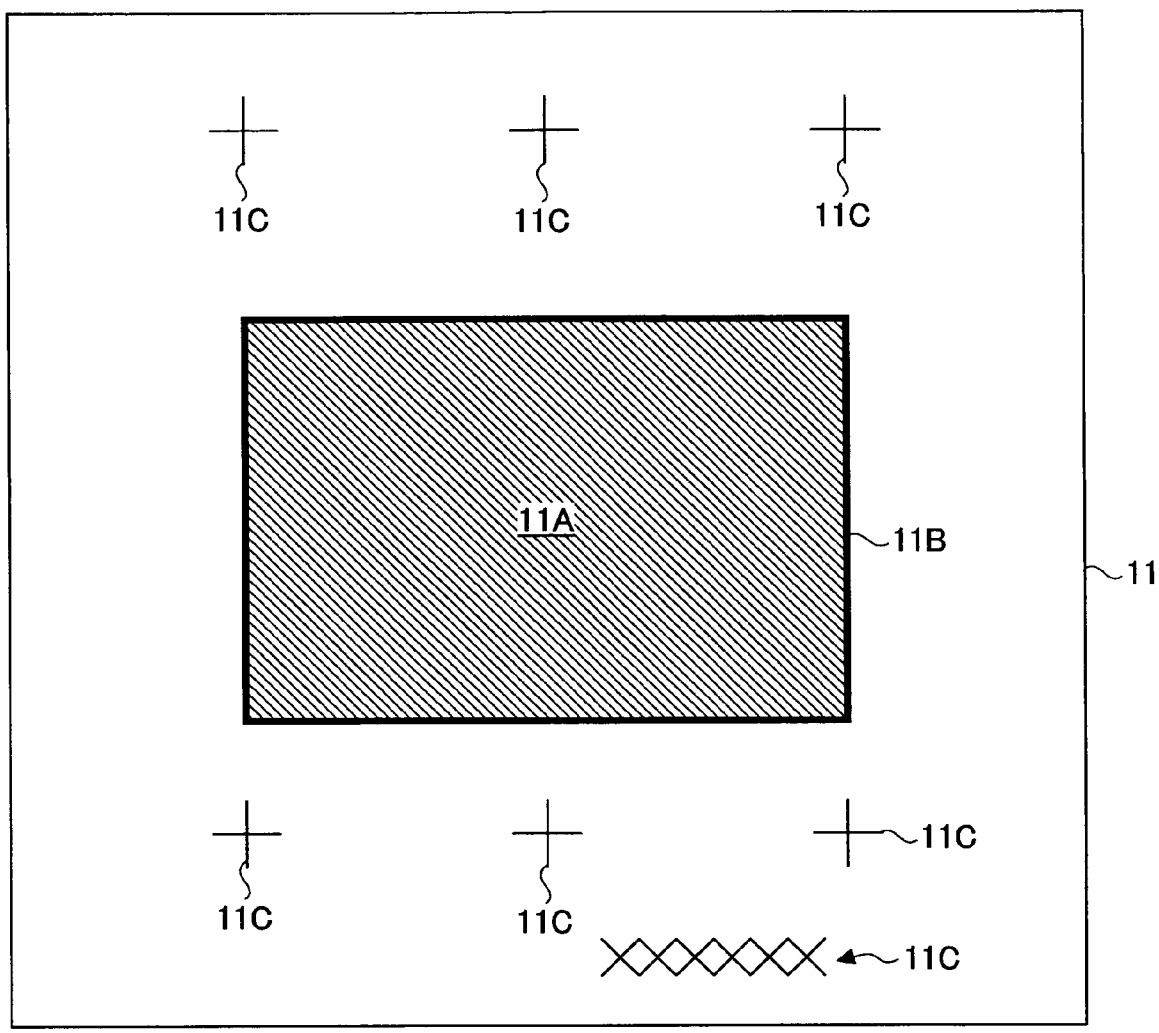
FIG. 3 is a plan view showing an example of a conventional negative photomask.
Figure 4:
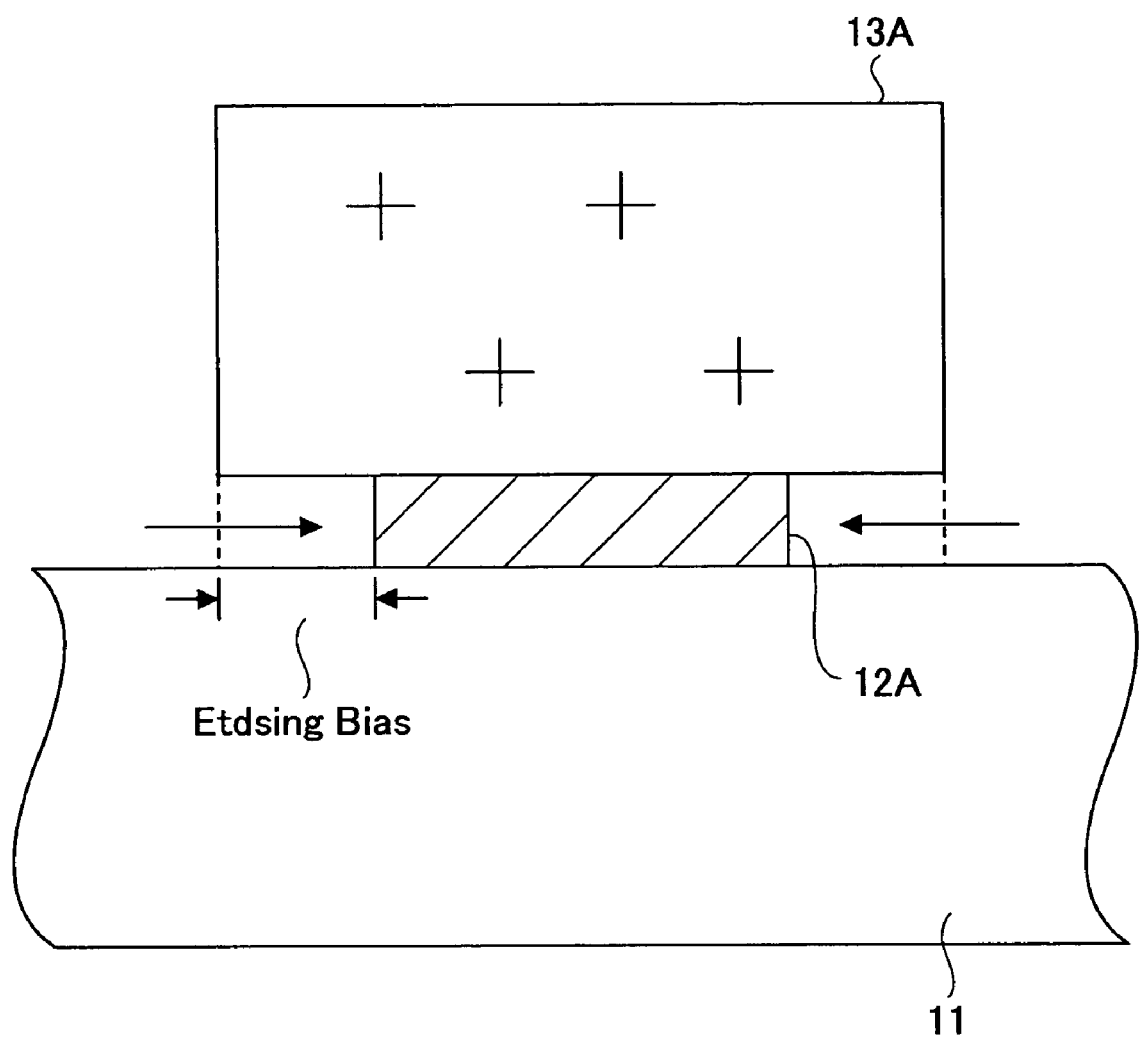
FIG. 4 is a diagram explaining the problem of conventional manufacturing method of a photomask.

Referring to FIGS. 7A and 7B, the negative photomask 40 is formed on a quartz glass substrate 41 similarly to the negative photomask of FIG. 3, wherein the negative photomask 40 includes an opaque device pattern 42A of a Cr pattern or the like corresponding to a device pattern formed on the quartz glass substrate 41 in a device chip area 41A defined on the quartz glass substrate 41 by a blind pattern 42B. Further, the negative photomask 40 includes a production serial mark pattern 42C of a Cr pattern or the like on the quartz glass substrate 41 in an outer region 41D of the foregoing device chip area 41A. Further, in the negative photomask 40 of the present embodiment, there is formed a continuous dummy opaque pattern 42D in the foregoing outer region 41D of the quartz glass substrate 41 so as to avoid the production serial mark pattern 41C.

FIGS. 8A-8D are diagrams showing the manufacturing process of the photomask 40, wherein FIGS. 8A-8D represent the cross-section taken along the line A-A' corresponding to FIG. 7B.

Referring to FIG. 8A, an opaque film 42 of Cr or the like is formed on the quartz glass substrate 41 and a negative resist 43 is coated upon the opaque film 42. Further, the substrate 41 is incorporated into an electron beam exposure apparatus and exposure is conducted therein by using electron beams EB1 and EB2 such that the device pattern 42A is exposed in the device chip area 41A with the electron beam EB1 and the dummy opaque pattern 42D is exposed in the outer region 41D of the device chip area 41A by using the electron beam EB2. Here, it should be noted that the blind pattern 41B is included in the dummy opaque pattern 42D. Further, it should be noted that there occurs no exposure of the resist film 43 by the electron beam EB2 at an edge part 41E of the quartz glass substrate 41 as such an edge part 41E is held by a jig (clamp mechanism) 51 of the electron beam exposure apparatus.

Next, in the step of FIG. 8B, the negative resist 43 thus exposed is developed, and a resist pattern 43A is formed in the device chip area 41A in correspondence to the device pattern and a resist pattern 43D is formed in the outer region 41D. Further, exposure corresponding to the production serial mark pattern 42C shown in FIG. 7A is conducted in the step of FIG. 8A in the foregoing outer region 41D, and there is formed a resist pattern corresponding to the production mark pattern 42C in the step of FIG. 8B as a result of the development of the resist film 43.

Further, in the step of FIG. 8C, the Cr film 42 is subjected to a dry etching process while using the resist patterns 43A and 43D as a mask, and thus, the opaque device pattern 42A is formed in the device chip area 41A and a continuous dummy opaque pattern 42D is formed in correspondence to the outer region 41D. Further, while not illustrated, the production serial mark pattern 42C is formed in the foregoing outer region 41D.

Next, in the step of FIG. 8D, the photomask of FIG. 7B is obtained by removing the resist patterns 43A and 43D. Thereby, the negative photomask thus formed by using such a negative resist generally includes an unexposed part at the edge part 41E of the quartz glass substrate 41 in correspondence to where clamping has been made by the clamp mechanism 51 of the electron beam exposure apparatus. Thus, the Cr film 42 is exposed in such an edge part 41E in the developing step of FIG. 8B, and the exposed Cr film 42 is removed in the dry etching step of FIG. 8C.

Thus, the negative photomask obtained in the step of FIG. 8D has the feature of an opening or cutout part 42d formed in the continuously formed dummy opaque pattern 42D in correspondence to the foregoing edge part 41E of the quartz glass substrate 41.

According to the present embodiment, the etching area of the Cr film 42 in the dry etching step of FIG. 3C is reduced by forming such a dummy opaque pattern 42D, and the problem of the conventional art associated with the dry etching of the Cr film over a large area explained with reference to FIGS. 1A-1D is eliminated.

Figure 9:
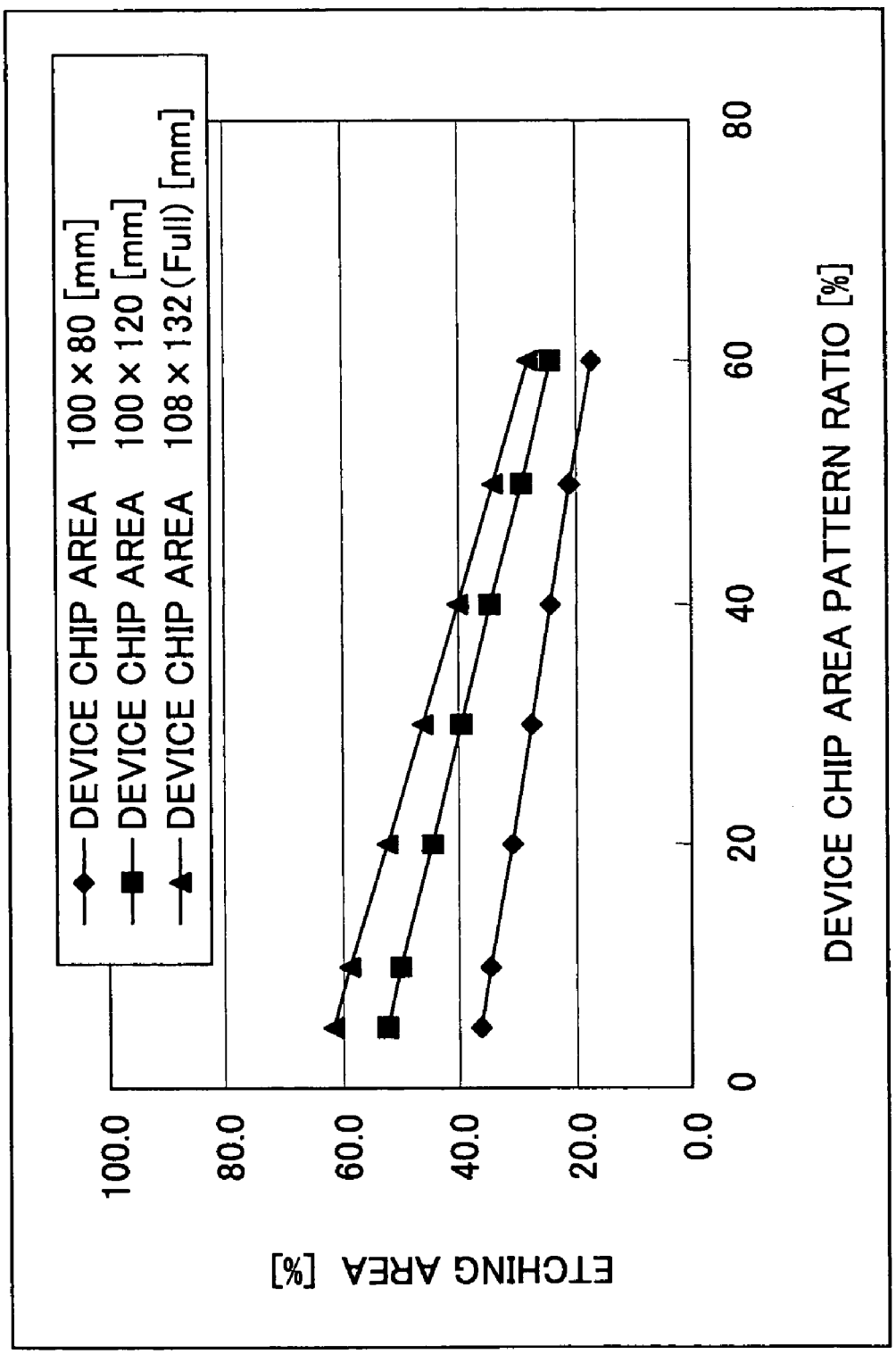
FIG. 9 is a diagram explaining the effect of the present invention.

FIG. 9 shows the relationship between the etching area of the Cr film 42 in the dry etching step of FIG. 8C and the device pattern occupation ratio inside the device chip area (device chip area pattern ratio).

Figure 10:
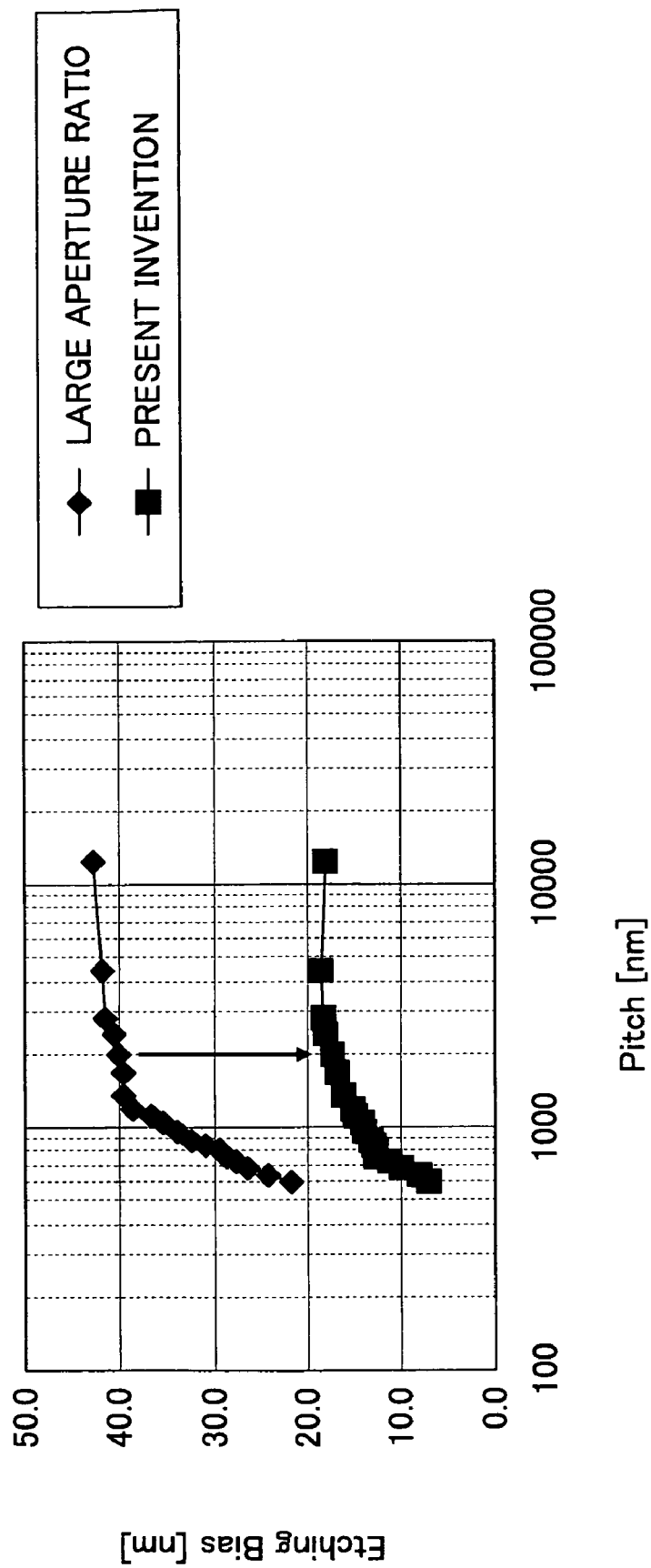
FIG. 10 is another diagram explaining the effect of the present invention.

Referring to FIG. 9, it will be noted that the etching area is decreased significantly with the present embodiment as compared with the similar negative photomask shown in FIG. 5B with the use of the dummy pattern, and with this, the etching bias is reduced to below 20 nm as indicated in FIG. 10 by an arrow. It should be noted that this etching bias is generally equal to the etching bias at the time of forming a positive photomask explained with reference to FIG. 6. Further, as a result of decrease of the etching area, the pattern-density dependence of the etching bias amount is also reduced to the degree comparable to the case of a positive photomask.

Thus, by using the negative photomask of the present embodiment, it becomes possible to improve the precision of the patterns exposed on a semiconductor substrate.

Further, as can be seen in the plan view of FIG. 7, such a photomask includes an opening 42F in the outer region 41D in correspondence to the production serial mark pattern 42C so as not to cover the production serial mark pattern 42C formed in such an outer region 41D.

Figure 11:
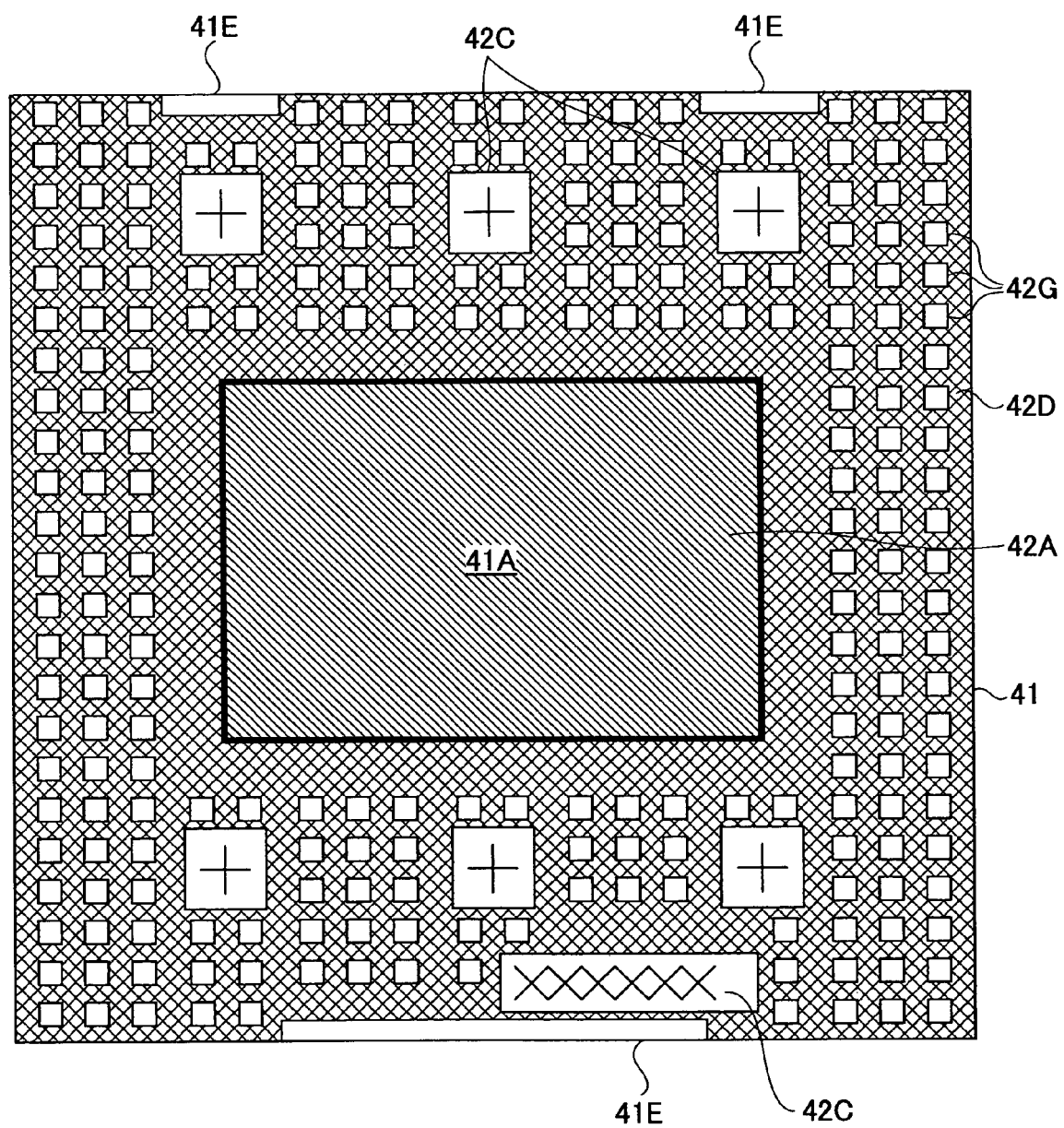
FIG. 11 is a diagram showing a negative photomask according to a modification of the first embodiment.

It should be noted that, in the present embodiment, there is no need that the dummy opaque pattern 42D forms a continuous pattern but the dummy pattern 42D may include cutout patterns 42G or other necessary patterns as represented in FIG. 11.

Second Embodiment

Figure 12A:
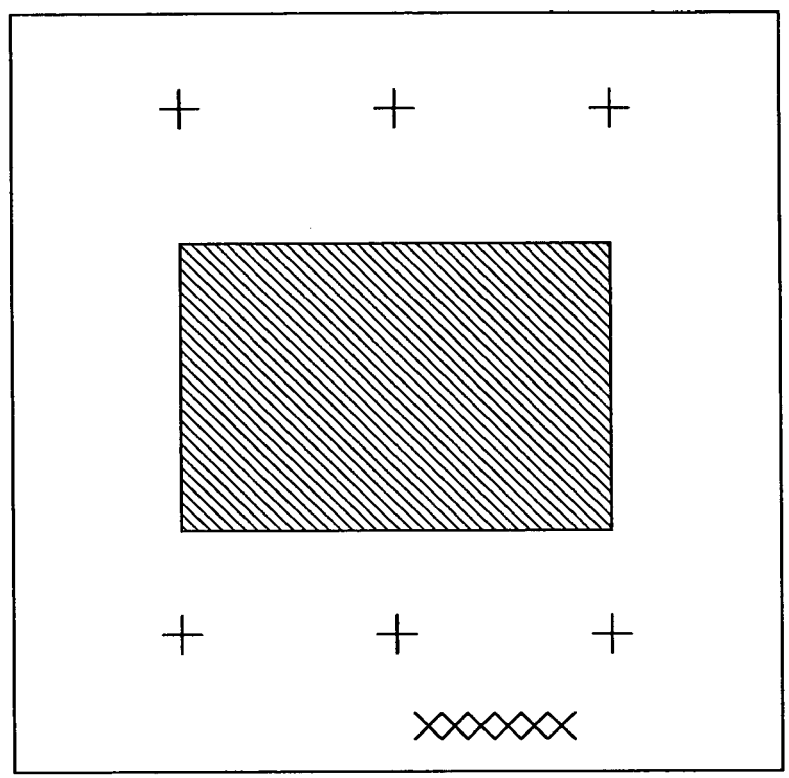
FIGS. 12A and 12B are diagrams showing the drawing data used with the manufacturing process of a photomask according to a second embodiment of the present invention.
Figure 12B:
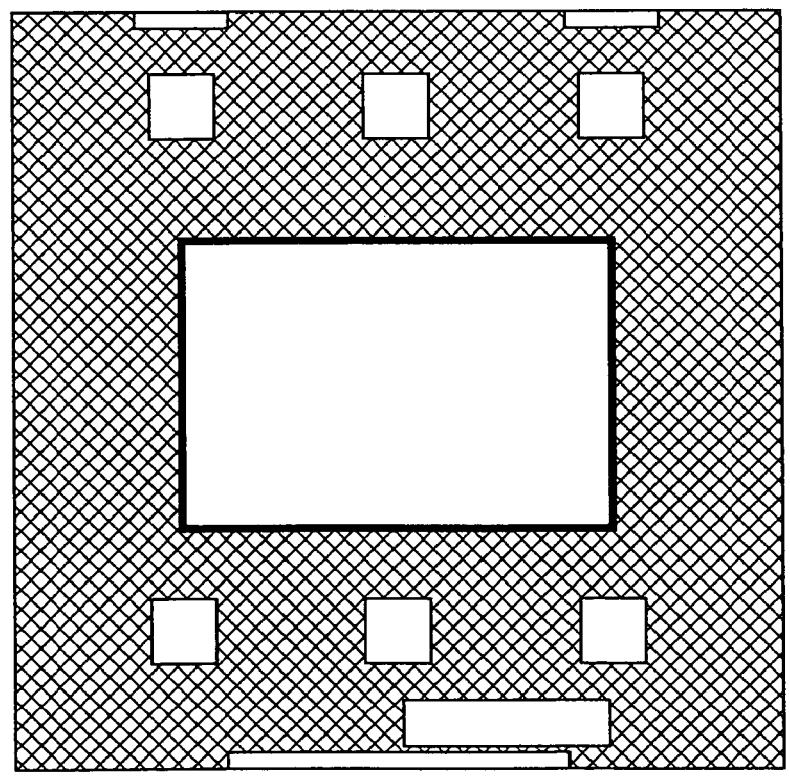

FIGS. 12A and 12B are diagrams showing the manufacturing process of a photomask according to a second embodiment of the present invention, particularly the exposure data used with the exposing step of FIG. 8A.

Referring to FIGS. 12A and 12B, the exposure data of FIG. 12A is the data used for exposing the device pattern 42A and the mask production serial mark pattern 42C in the device chip area 41A in the exposure step of FIG. 8A by the electron beam EB1, while the exposure data of FIG. 12B is the data for exposing the dummy opaque pattern 42D including the blind pattern 42B in the foregoing outer region 41D in the exposure step of FIG. 8A by using the electron beam EB2. In the present embodiment, the exposure using the data of FIG. 8A and the exposure using the data of FIG. e8B are conducted separately.

In the case of exposing a device pattern of recent highly miniaturized semiconductor device or the mask production serial pattern on the photomask, it is generally practiced to use a so-called multiple exposure technology in which the exposure process is repeated while displacing the exposure area each time in partially overlapping relationship for reducing the error of the exposure. While such a multiple exposure technology is useful for suppressing the error of exposure, the use of multiple exposure technology inevitably causes the problem of decrease of exposure throughput.

Because there is no need of high precision exposure for the exposure of the dummy opaque pattern 42D in the present embodiment, it becomes possible to separate the exposure data for the dumpy opaque pattern 42D shown in FIG. 12B from the device pattern 42A and the mask production serial pattern 42C shown in FIG. 12A. Thus, in the exposure step of FIG. 8A, the exposure of the device pattern 42A and the mask production serial pattern 42C is conducted by using the exposure data of FIG. 12A with the electron beam EB1 while applying the multiple exposure technology, and the exposure of the dummy opaque pattern 42D is conducted separately by using the exposure data of FIG. 12B with the electron beam EB2, without using the time-consuming multiple exposure technology. With this, the time needed for manufacturing the mask is reduced with regard to the exposure of the dummy opaque pattern 42D.

Third Embodiment

Figure 13:
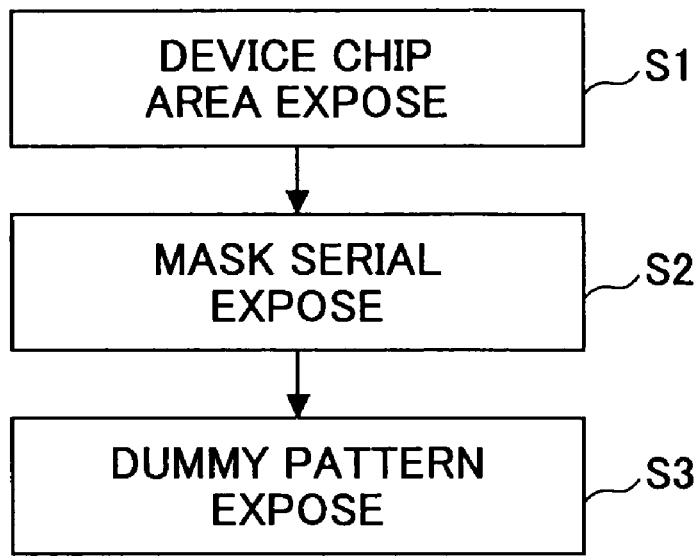
FIG. 13 is a flowchart showing the manufacturing process of a photomask according to a third embodiment of the present invention.

FIG. 13 shows the process of manufacturing a photomask according to a third embodiment of the present invention.

In the present embodiment, too, exposure of the device pattern 42A and the mask production serial mark pattern 42C is conducted separately from the exposure of the dummy opaque pattern 42D, wherein it should be noted that the present embodiment achieves the exposure of the device pattern 42A in the device chip area 41A first in the step 1, and then conduct the exposure of the mask production serial pattern 42C in the foregoing outside region 41D in the next step 2. In this case, the exposure of the dummy opaque pattern including the blind pattern 42B is conducted in the final step 3.

It should be noted that this final step 3 takes time in view of the need of exposing a large area. Thus, in the event this exposure of the dummy opaque pattern 42D is conducted at the same time to the exposure of the device pattern 42A and the mask production serial mark pattern in the device chip area 41A, there is a tendency that deviation of alignment called "closure" is caused because of conducting the exposure after exposure of the dummy opaque pattern 42D conducted for a long time. With the present embodiment, such a deviation of alignment is successfully minimized. As noted before, no high precision exposure is needed in the exposure of the dummy exposure pattern.

Further, a similar effect is achieved also in the case the exposure of the step 3 is conducted at first (step 1) in the present embodiment. Thus, what is important with the present invention is to carry out the exposure of the dummy pattern either at the beginning or at the end of the overall exposure process and the order of the step 1 and the step 3 may be changed.

Fourth Embodiment

Figure 14:
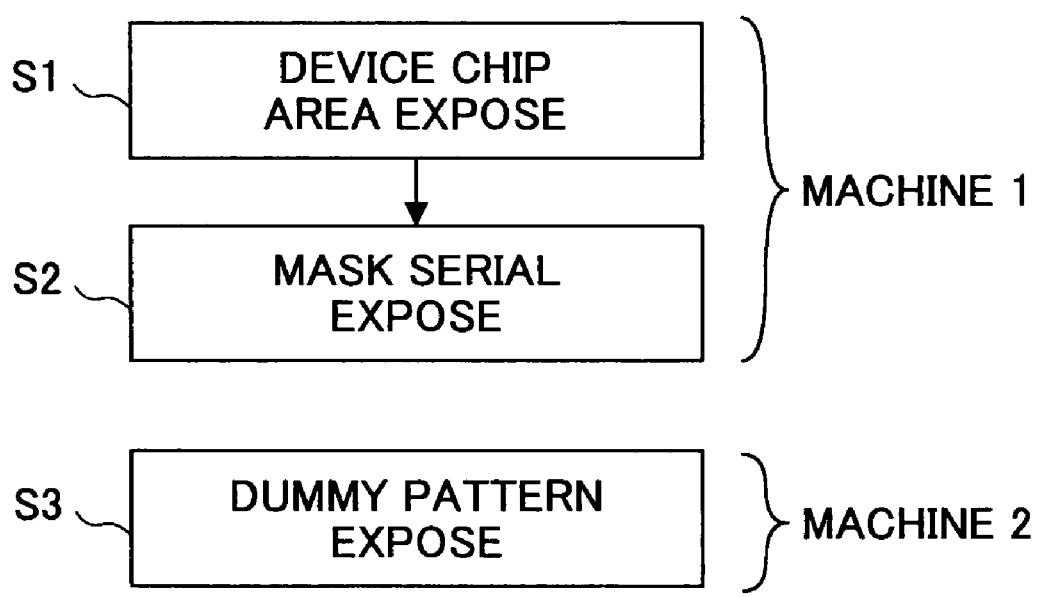
FIG. 14 is a flowchart showing the manufacturing process of a photomask according to a fourth embodiment of the present invention.
Figure 15:
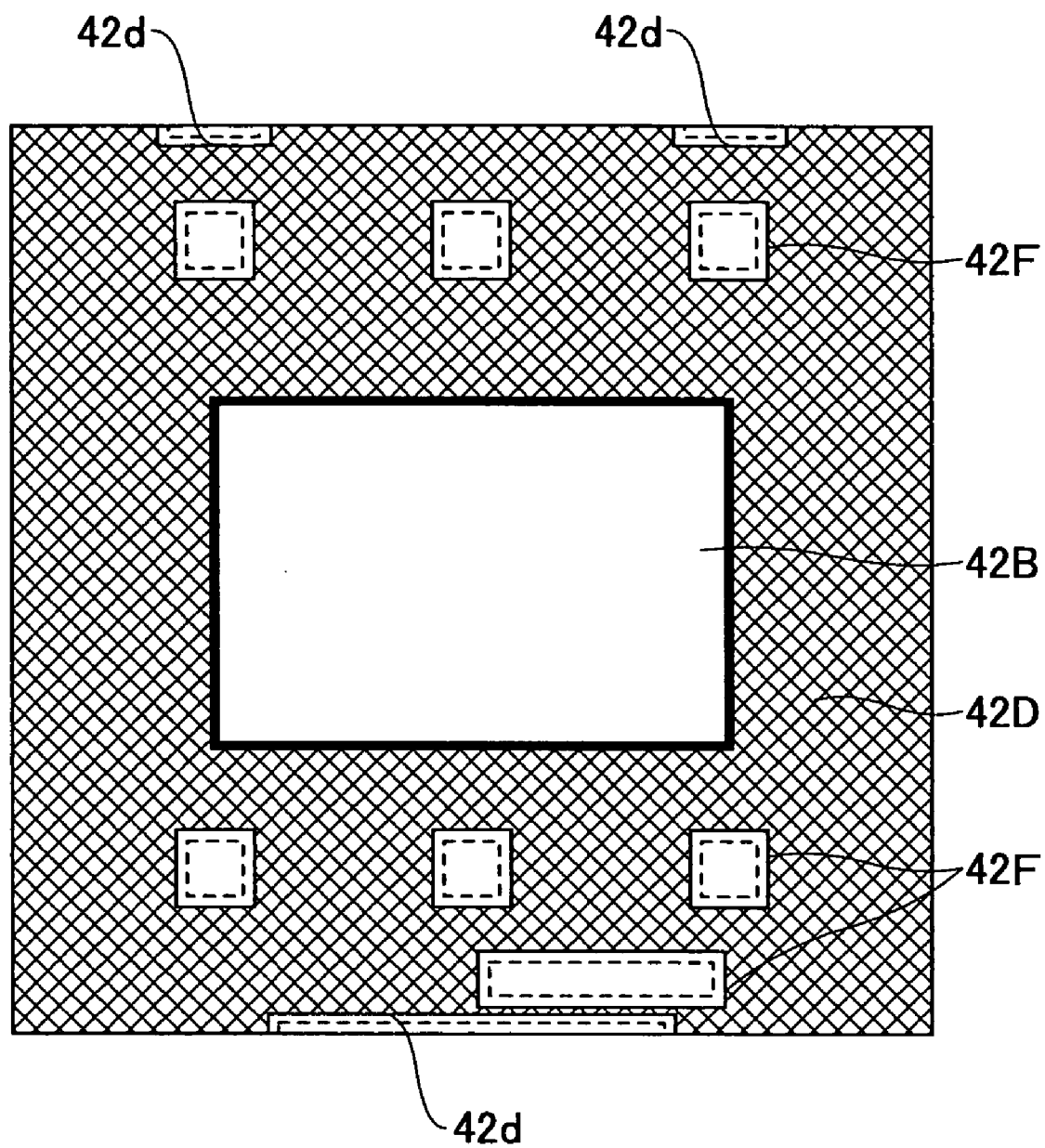
FIG. 15 is a diagram showing the photomask of the fourth embodiment.

FIG. 14 shows the process of manufacturing a photomask according to a fourth embodiment of the present invention.

Referring to FIG. 14, the present embodiment carries out the exposure of the device chip area in the step 1 and the exposure of the mask production serial mark pattern 42C in the step 2 by using an exposure apparatus 1 with the exposure data explained with FIG. 12A and further carries out the exposure of the dummy opaque pattern 42D in the step 3 by using another exposure apparatus 2, wherein the exposure data used with the step 3 includes the cutouts 42d or 42F with a size slightly larger than those of the exposure data of FIG. 12B shown in the drawing by a dotted line, in view the possible centrality error, which may be caused at the time of using the exposure apparatus 2. Thereby, the problem of the production serial mark pattern 42C formed on the substrate 41 being covered with the dummy pattern 42D is avoided.

According to the present invention, it becomes possible to use an exposure apparatus of lower resolution for the exposure step 3 exposing the dummy opaque pattern 42D, and it becomes possible to improve the efficiency of the process of manufacturing the photomask.

Fifth Embodiment

Heretofore, the present invention has been explained for the case of so-called binary photomasks in which an opaque pattern such as a Cr pattern is formed directly on the quartz glass substrate, while the present invention is also effective for the case of so-called halftone mask that uses super resolution technology.

FIGS. 16A-16F show the manufacturing process of such a halftone mask for the process of forming the device chip area.

Figure 16A:
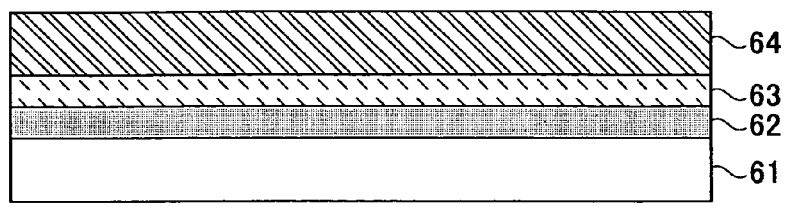
FIGS. 16A-16F are diagrams showing the manufacturing process of a photomask according to a fifth embodiment of the present invention.

Referring to FIG. 16A, there are formed a halftone film 62 of the transmissivity of 6% and a CR film 63 are formed on a quartz glass substrate 61 consecutively, and a resist film 64 is formed on the Cr film 63.

Figure 16B:
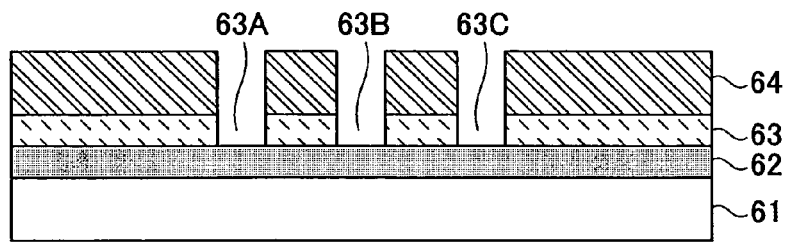

Next, in the step of FIG. 16B, the resist film 64 is patterned by an electron beam exposure process, and openings 63A, 63B and 63C are formed in the Cr film 63 by conducting a dry etching of the Cr film 63 while using the patterned resist film 64 as a mask.

Figure 16C:
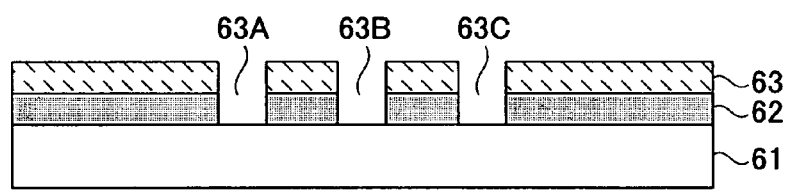

Next, in the step of FIG. 16C, the resist film 64 is removed and the underlying halftone film 62 is subjected to a dry etching process while using the Cr film 63 as a mask. With this, openings 62A, 62B and 62C are formed in the halftone film 62.

Figure 16D:
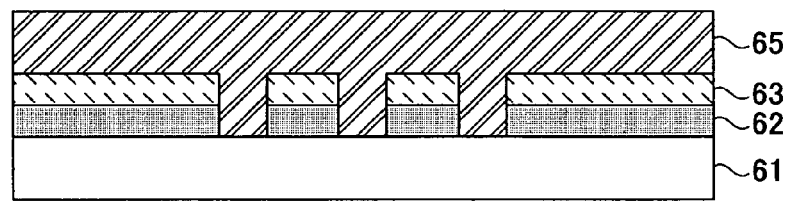
Figure 16E:
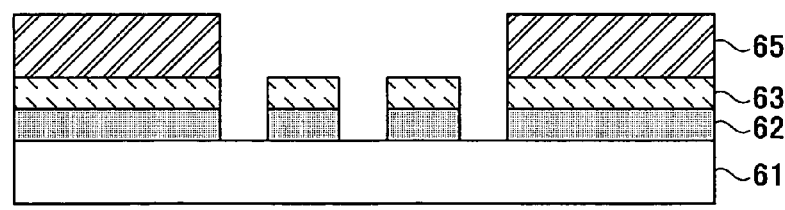
Figure 16F:
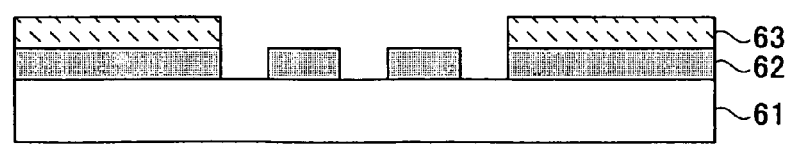

Further, in the step of FIG. 16D, a resist film 65 is formed on the structure of FIG. 16C, followed by a patterning process of the resist film 65 in the step 16E such that a part of the Cr pattern 62 is exposed. Further, by removing the exposed Cr film 63 in the step of FIG. 16F while using the resist film 65 as a mask, the desired super resolution photomask is obtained.

With such a super resolution photomask, too, it is possible to form the dummy opaque mask in the outer region by using a negative resist for the resist film 64 and by exposing the outer region of the device chip area similarly to the case of the previous embodiments. Thereby, excessive lateral etching of the Cr film 63 or the half tone film 62 is avoided in the step of FIG. 16B or FIG. 16C, and high-precision halftone mask is obtained.

Because such a dummy opaque pattern is formed outside of the device chip area with the present invention, there is obtained a further advantageous feature in that stray light, caused in the exposure apparatus by various irregularity of the optical system used therein, is successfully interrupted at the time of the exposure of device pattern on a semiconductor substrate, and the problem of so-called global flare, originating from such a stray light, is effectively suppressed. Thereby, high precision device pattern can be formed.

Sixth Embodiment

Hereinafter, an example of forming a semiconductor device pattern by a photolithographic process using such a halftone photomask will be explained with reference to FIGS. 17A-17D.

Figure 17A:
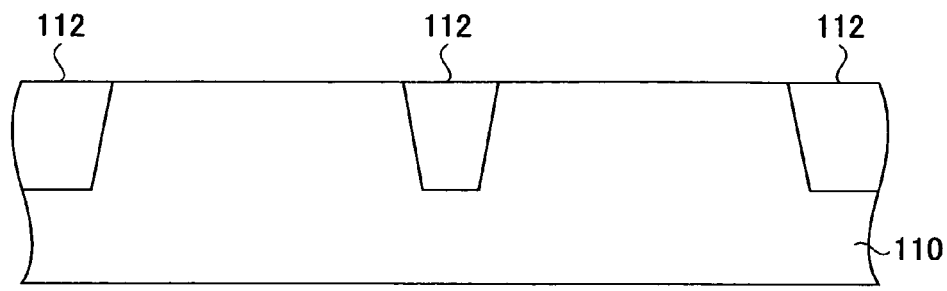
FIGS. 17A-17E are diagrams showing the manufacturing process of a photomask according to a sixth embodiment of the present invention.

Referring to FIG. 17A, there is formed a device isolation trench 112 in a silicon substrate 110 with a depth of 300 nm, for example, by an STI process, and the device isolation trench 112 is filled with a device isolation film. In FIG. 17A, it should be noted that the left region of the central device isolation structure 112 is used for the device region of an n-channel MOS transistor, while the right region of the central device isolation structure 112 is used for the device region of a p-channel MOS transistor.

Figure 17B:
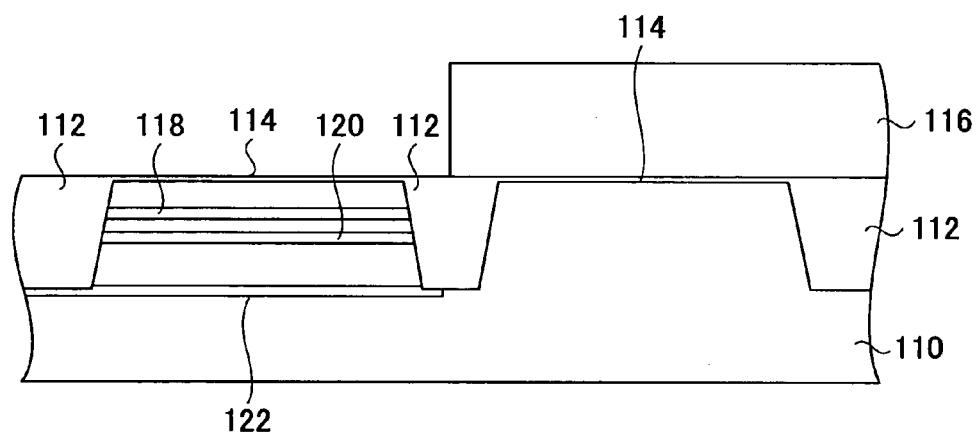

Next, in the step of FIG. 17B, a sacrificial oxide film 114 is formed on the silicon substrate 110 by a thermal oxidation process, for example, and a photoresist 116 is formed on the structure thus formed with the sacrificial oxide film 114 by a photolithographic process on the structure of FIG. 17A such that the device region of the n-channel MOS transistor is exposed and the device region of the p-channel MOS transistor is covered.

Further, in the step of FIG. 17B, ion implantation is conducted while using the photoresist 116 as a mask to form p-type diffusion regions 118, 120 and 122 in the silicon substrate 110.

For example, the p-type diffusion region 118 is formed by introducing indium ions (In+) under the acceleration energy of 60 keV with the dose of $1 \times 10^{13}$ cm$^{-2}$. Further, the p-type diffusion region 120 can be formed by introducing indium ions under the acceleration voltage of 180 keV with the dose of $3 \times 10^{13}$ cm$^{-2}$. Further, the p-type diffusion region 122 can be formed by introducing boron ions (B+) under the acceleration energy of 150 keV with the dose of $3 \times 10^{13}$ cm$^{-2}$.

Figure 17C:
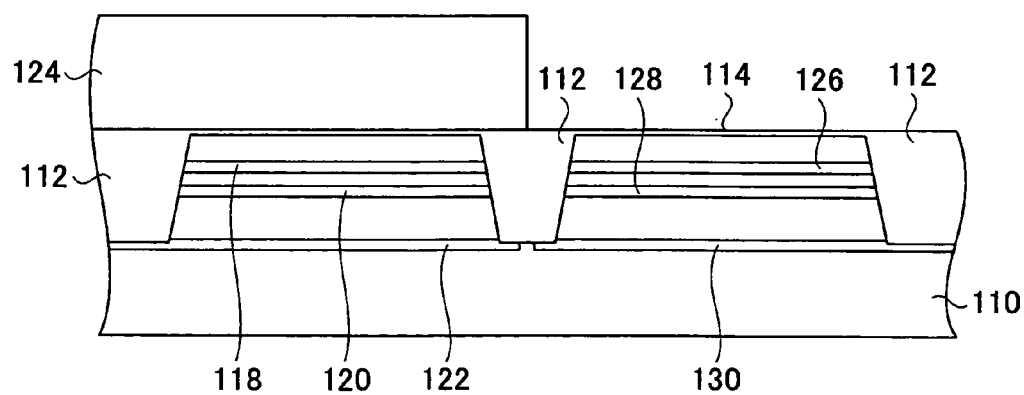

Next, in the step of FIG. 17C, the device region of the p-channel MOS transistor is exposed by a photolithographic process and a photoresist 124 is formed so as to cover the device region of the n-channel MOS transistor.

Further, in the step of FIG. 17C, ion implantation is conducted while using the photoresist 124 as a mask, to form n-type diffusion regions 126, 128 and 130 in the silicon substrate 110.

Thereby, the n-type diffusion region 126 may be formed for example by introducing arsenic ions (As+) under the acceleration energy of 100 keV with the dose of $5 \times 10^{12}$ cm$^{-2}$. On the other hand, the n-type diffusion region 128 may be formed by introducing arsenic ions (As+) under the acceleration energy of 150 keV with the dose of $3 \times 10^{13}$ cm$^{-2}$. Further, the n-type diffusion region 130 may be formed by introducing phosphorus ions (P+) under the acceleration energy of 300 keV with the dose of $3 \times 10^{13}$ cm$^{-2}$.

Next, in the step of FIG. 17C, the sacrificial oxide film 114 is removed by a wet etching process using an HF aqueous solution and the surface of the silicon substrate 11 is exposed.

Figure 17D:
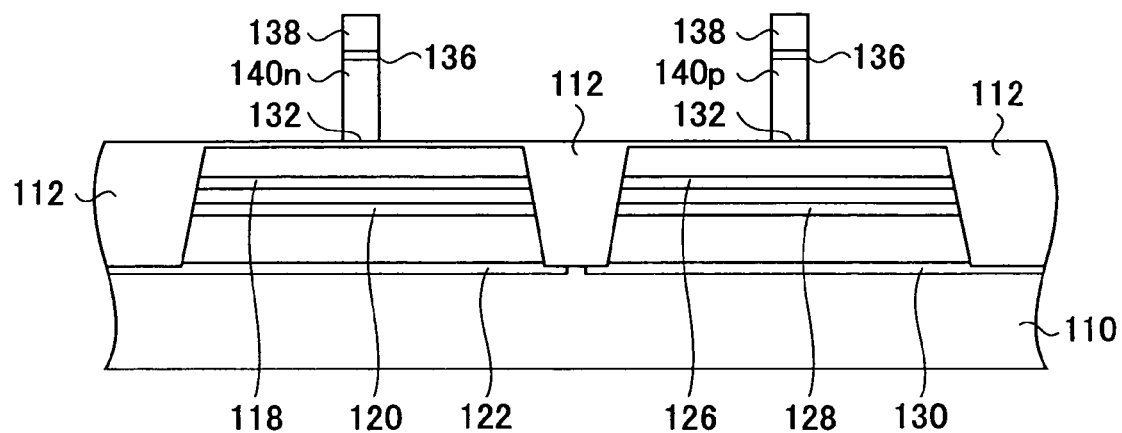

Next, in the step of FIG. 17D, a thermal oxidation process is conducted and a gate insulation film 32 is formed by growing a silicon oxide film on the surface of the silicon substrate exposed in the previous step of FIG. 17C as a result of removal of the sacrificial oxide film 114, with a thickness of 11 nm, for example.

Further, a polysilicon film is deposited on the gate insulation film 132 with a thickness of 100 nm by a CVD process, for example, and an organic antireflection coating 136 is formed on the polysilicon film thus formed with a thickness of about 80 nm. Further, a positive resist of ArF type is applied on the antireflection coating 136 with a thickness of 250-300 nm.

Next, in this state, the pattern of the foregoing photomask is exposed on the silicon wafer that constitutes the silicon substrate 110 by using a demagnification exposure apparatus that uses an ArF excimer laser as an optical source. For example, the exposure may be conducted with an exposure dose of 210 J/cm$^2$, provided that an optical system having the numerical aperture NA of 0.7 is used together with ½ ring illumination (σ:0.425/0.85).

Next, in the step of FIG. 17D, thermal annealing (PEB) process and developing process have been applied to the resist film and a resist pattern 138 is formed as a result of patterning of the resist film.

Further, the antireflection coating 136, the polysilicon film 134 and the gate oxide film 132 are subjected to dry etching while using the resist pattern 138 as a mask, and gate electrodes 140n and 140p of polysilicon are formed. Here, the gate electrode 140 serves for the gate electrode of the n-channel MOS transistor while the gate electrode 140p serves for the gate electrode of the p-channel MOS transistor.

Figure 17E:
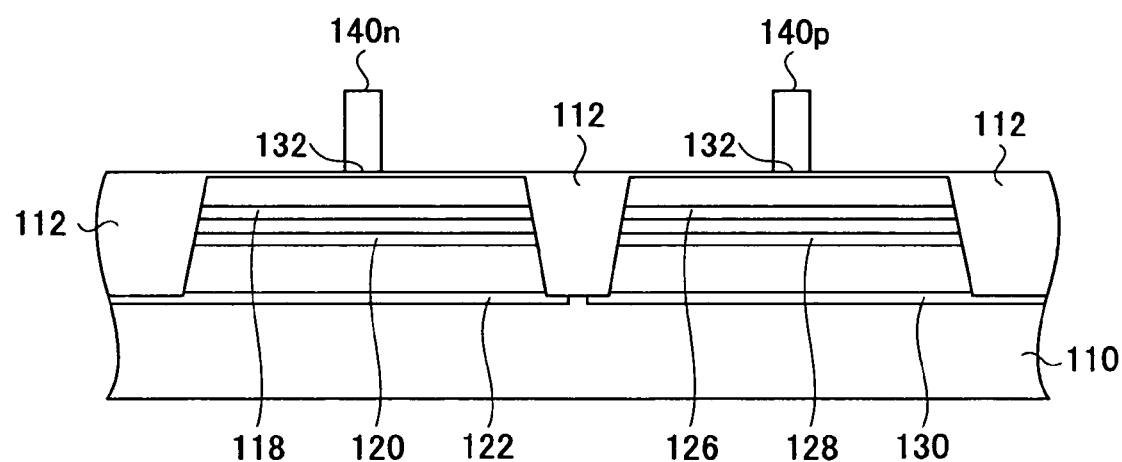

Further, by removing the resist film 138 and the anti-reflection coating 136, the CMOS device shown in FIG. 17E is obtained.

With regard to the CMOS device thus obtained, investigation has been made on the uniformity of pattern size, and it was confirmed that the uniformity of the pattern size is improved by about 4 nm in the case the mask of the present invention has been used as compared with the case in which the conventional mask has been used.

Further, while the degree of the effect may be changed depending on the demagnification projection exposure apparatus used, it became further possible to eliminate the effect of global flare more or less by using the photomask of the present invention. Thus, with the present invention, fabrication process of semiconductor devices is improved significantly.

Further, the present invention is not limited to the embodiments described heretofore, but various variations and modifications may be made without departing from the scope of the invention.

What is claimed is:

1. A negative photomask, comprising:
a transparent substrate defined with a device chip area;
an opaque device pattern formed on said transparent substrate in said device chip area; and a dummy opaque pattern provided on said transparent substrate outside of said device chip area, wherein an inner edge of said dummy opaque pattern forms a blind pattern.

2. The negative photomask as claimed in claim 1, wherein said dummy opaque pattern comprises a continuous opaque film.

3. The negative photomask as claimed in claim 1, wherein said dummy opaque pattern comprises a plurality of patterns.

4. The negative photomask as claimed in claim 1, wherein said transparent substrate carries a mark pattern outside said device chip area, and wherein said dummy opaque pattern is formed so as to avoid said mark pattern.

5. The negative photomask as claimed in claim 1, wherein said dummy opaque pattern includes an opening exposing said transparent substrate at an edge part of said transparent substrate.

6. The negative photomask as claimed in claim 1, wherein there is formed a halftone film pattern in said device chip area between said transparent substrate and said opaque device pattern.

7. A method of manufacturing a negative photomask, comprising the steps of:
exposing a negative resist formed on an opaque film on a substrate to form a negative resist pattern on a device chip area of said substrate;
patterning said opaque film in said device chip area while using said negative resist pattern as a mask to form a device pattern in said device chip area of said substrate by said opaque film; and
further exposing said negative resist in an outer region of said device chip area of said substrate, such that an inner edge of said outer region forms a blind pattern of said negative photomask.

8. The method as claimed in claim 7, wherein said step of exposing said outer region is conducted uniformly over said outer region except for an edge part of said substrate and a part where a mark is formed.

9. The method as claimed in claim 7, wherein said step of exposing said negative resist in said outer region is conducted based on exposure data different from exposure data used for exposing said device chip area.

10. The method as claimed in claim 7, wherein said step of exposing said negative resist in said outer region is conducted without using a multiple exposure technology.

11. The method as claimed in claim 7, wherein said step of exposing said negative resist in said outer region is conducted as a final exposure step of exposure steps used for fabricating said photomask.

12. The method as claimed in claim 7, wherein said step of exposing said negative resist for forming said negative resist pattern on said device chip area is conducted in a first exposure apparatus, and wherein said step of exposing said negative resist in said outer region is conducted in a second exposure apparatus.

13. A method of fabricating an electron device, comprising an exposure step exposing a pattern on a substrate, said exposure step being conducted by using a negative photomask, said negative photomask comprising:
a transparent substrate defined with a device chip area;
an opaque device pattern formed on said transparent substrate in said device chip area; and
a dummy opaque pattern provided on said transparent substrate outside of said device chip area,
wherein an inner edge of said dummy opaque pattern forms a blind pattern.

* * * * *